United States Patent
Masumoto

(10) Patent No.: US 8,324,959 B2
(45) Date of Patent: Dec. 4, 2012

(54) BIAS CIRCUIT AND WIRELESS COMMUNICATION DEVICE INCLUDING THE BIAS CIRCUIT

(75) Inventor: Yasuyuki Masumoto, Shiga (JP)

(73) Assignee: Panasonic Corporation, Osaka (JP)

( * ) Notice: Subject to any disclaimer, the term of this patent is extended or adjusted under 35 U.S.C. 154(b) by 63 days.

(21) Appl. No.: 13/106,571

(22) Filed: May 12, 2011

(65) Prior Publication Data

US 2011/0304385 A1  Dec. 15, 2011

(30) Foreign Application Priority Data

Jun. 10, 2010 (JP) .................................. 2010-132525
Dec. 10, 2010 (JP) .................................. 2010-275195

(51) Int. Cl.
*G05F 1/10* (2006.01)
(52) U.S. Cl. ........................................ 327/530; 323/315
(58) Field of Classification Search .................. 327/530; 323/315
See application file for complete search history.

(56) References Cited

U.S. PATENT DOCUMENTS

| | | | | |
|---|---|---|---|---|
| 4,501,979 A | * | 2/1985 | Null et al. ...................... | 330/200 |
| 4,567,381 A | * | 1/1986 | Piasecki ......................... | 327/542 |
| 5,373,252 A | * | 12/1994 | Naito ............................. | 330/288 |
| 5,401,995 A | * | 3/1995 | Lari et al. ....................... | 257/539 |
| 5,457,422 A | * | 10/1995 | Rotay ............................. | 327/538 |
| 5,594,382 A | * | 1/1997 | Kato et al. ..................... | 327/541 |
| 5,945,873 A | * | 8/1999 | Antone et al. ................. | 327/541 |
| 6,348,835 B1 | * | 2/2002 | Sato et al. ...................... | 327/543 |
| 6,384,687 B1 | * | 5/2002 | Maida ............................. | 330/296 |
| 6,486,739 B1 | * | 11/2002 | Luo ................................. | 330/288 |
| 6,489,827 B1 | * | 12/2002 | Sutardja ......................... | 327/307 |
| 6,549,076 B2 | | 4/2003 | Kuriyama | |
| 6,552,613 B2 | * | 4/2003 | Murray et al. ................. | 330/255 |
| 6,922,107 B1 | | 7/2005 | Green | |
| 6,946,913 B2 | | 9/2005 | Moriwaki et al. | |
| 7,088,183 B2 | | 8/2006 | Kuriyama | |
| 7,248,111 B1 | | 7/2007 | Xu et al. | |
| 7,564,230 B2 | | 7/2009 | Liwinski | |
| 8,228,122 B1 | * | 7/2012 | Yuen et al. .................... | 330/289 |

FOREIGN PATENT DOCUMENTS

JP  2005-101733  4/2005

* cited by examiner

*Primary Examiner* — Thomas J Hiltunen
(74) *Attorney, Agent, or Firm* — Hamre, Schumann, Mueller & Larson, P.C.

(57) ABSTRACT

A bias circuit according to the present invention includes: a transistor for supplying a bias current from the emitter of the transistor; an emitter potential generating device for supplying a potential to the emitter of the transistor; a switch element; and a voltage supply circuit for supplying a base voltage to the base of the transistor in response to the on/off of the switch element, wherein the emitter potential generating device generates a potential causing a potential difference between the base and emitter of the transistor to fall below a saturation voltage at the junction of the transistor, even in the case where the base of the transistor is fed with a voltage not lower the saturation voltage at the junction of the transistor.

7 Claims, 7 Drawing Sheets

BIAS CIRCUIT AND WIRELESS COMMUNICATION DEVICE INCLUDING THE BIAS CIRCUIT

The disclosures of Japanese Patent Application No. 2010-132525 filed Jun. 10, 2010 and Japanese Patent Application No. 2010-275195 filed Dec. 10, 2010 including specifications, drawings and claims are incorporated herein by reference in its entirety.

FIELD OF THE INVENTION

The present invention relates to a bias circuit for supplying a bias current and a wireless communication device including the bias circuit.

BACKGROUND OF THE INVENTION

FIG. 8 shows a bias circuit illustrated in FIG. 5 of Japanese Patent Laid-Open No. 2005-101733. The bias circuit includes three bipolar transistors Q1 to Q3 and three resistors R1 to R3, and a bias current is supplied from the emitter of the bipolar transistor Q2 constituting a collector ground circuit (emitter follower). Hereinafter, the bipolar transistors Q1 to Q3 will be referred to as transistors Q1 to Q3.

In the bias circuit, a reference voltage Vref is applied in common to the bases of the transistors Q1 and Q2 from a power supply terminal 7 through the resistor R3.

When the reference voltage Vref is 0 V, the base potentials of the transistors Q1 and Q2 are also 0 V, so that there is no potential difference between the bases and emitters of the transistors Q1 and Q2 and a current Idc is not generated that flows from a power supply terminal 4 to the collectors of the transistors Q1 and Q2. Thus the supply of a bias current is stopped.

DISCLOSURE OF THE INVENTION

As has been discussed, when the reference voltage Vref applied in common to the bases of the transistors Q1 and Q2 is 0 V, the bias current supply is stopped.

As shown in FIG. 9, in the case where a depletion-type field-effect transistor T1 (hereinafter, the depletion-type field-effect transistor T1 will be referred to as D-FET_T1) is used as a device for controlling the on/off of the reference voltage Vref, power consumption increases in a period during which the bias current supply is stopped, depending on the threshold voltage of the D-FET_T1. Specifically, when the D-FET_T1 is turned off to interrupt the reference voltage Vref supplied from the power supply terminal 7, a voltage for turning off the D-FET_T1 allows a voltage not lower than saturation voltages at the junctions of the transistors Q1 and Q2 to be applied to the bases of the transistors Q1 and Q2 depending on the threshold voltage of the D-FET_T1. When the voltage not lower than the saturation voltages at the junctions of the transistors Q1 and Q2 is applied to the bases of the transistors Q1 and Q2, the transistors Q1 and Q2 cannot be completely turned off and the current Idc flows to the collectors of the transistors Q1 and Q2 from the power supply terminal 4. Consequently, power consumption increases in a period during which the bias current supply is stopped.

An object of the present invention is to provide a bias circuit that can achieve lower power consumption even in the case where a voltage not lower than a saturation voltage at the junction of a transistor is applied to the base of the transistor that supplies a bias current from the emitter, in a period during which bias current supply from the bias circuit is stopped.

Another object of the present invention is to provide a wireless communication device that can achieve lower power consumption.

In order to attain the objects, a bias circuit according to the present invention includes:

a first transistor for supplying a bias current from the emitter of the first transistor;

an emitter potential generating device for supplying a potential to the emitter of the first transistor;

a switch element; and a voltage supply circuit for supplying a base voltage to the base of the first transistor in response to the on/off of the switch element, wherein the emitter potential generating device generates a potential causing a potential difference between the base and emitter of the first transistor to fall below a saturation voltage at the junction of the first transistor, even in the case where the base of the first transistor is fed with a voltage not lower than the saturation voltage at the junction of the first transistor.

The bias circuit of the present invention may further include a first resistor having one end connected to the emitter of the first transistor and the other end connected to the emitter potential generating device.

Further, the voltage supply circuit may include:

a second transistor having an emitter fed with a potential from the emitter potential generating device and a base fed with a voltage through the switch element; and a third transistor having a collector connected to the base of the second transistor, an emitter connected to a ground potential, and a base connected to the emitter of the second transistor, and the base of the second transistor may be connected to the base of the first transistor.

Moreover, the voltage supply circuit may further include:

a second resistor having one end connected to the emitter of the second transistor and the other end connected to the emitter potential generating device; and a third resistor having one end connected to the base of the second transistor and the other end fed with a voltage through the switch element.

Further, the switch element may be a depletion-type field-effect transistor.

Moreover, the emitter potential generating device may generate a potential determined by adding the forward voltage (leading edge voltage) of a diode to a ground potential.

A wireless communication device of the present invention is a wireless communication device with multiple modes, including: bias circuits provided for the respective modes; and a logic circuit for controlling the switch elements of the bias circuits to switch the modes, the bias circuits being configured according to the present invention.

According to the present invention, power consumption can be reduced even in the case where a voltage not lower than the saturation voltage at the junction of the transistor is applied to the base of the transistor that supplies a bias current from the emitter, in a period during which bias current supply from the bias circuit is stopped.

DESCRIPTION OF THE EMBODIMENT

Figure 1:
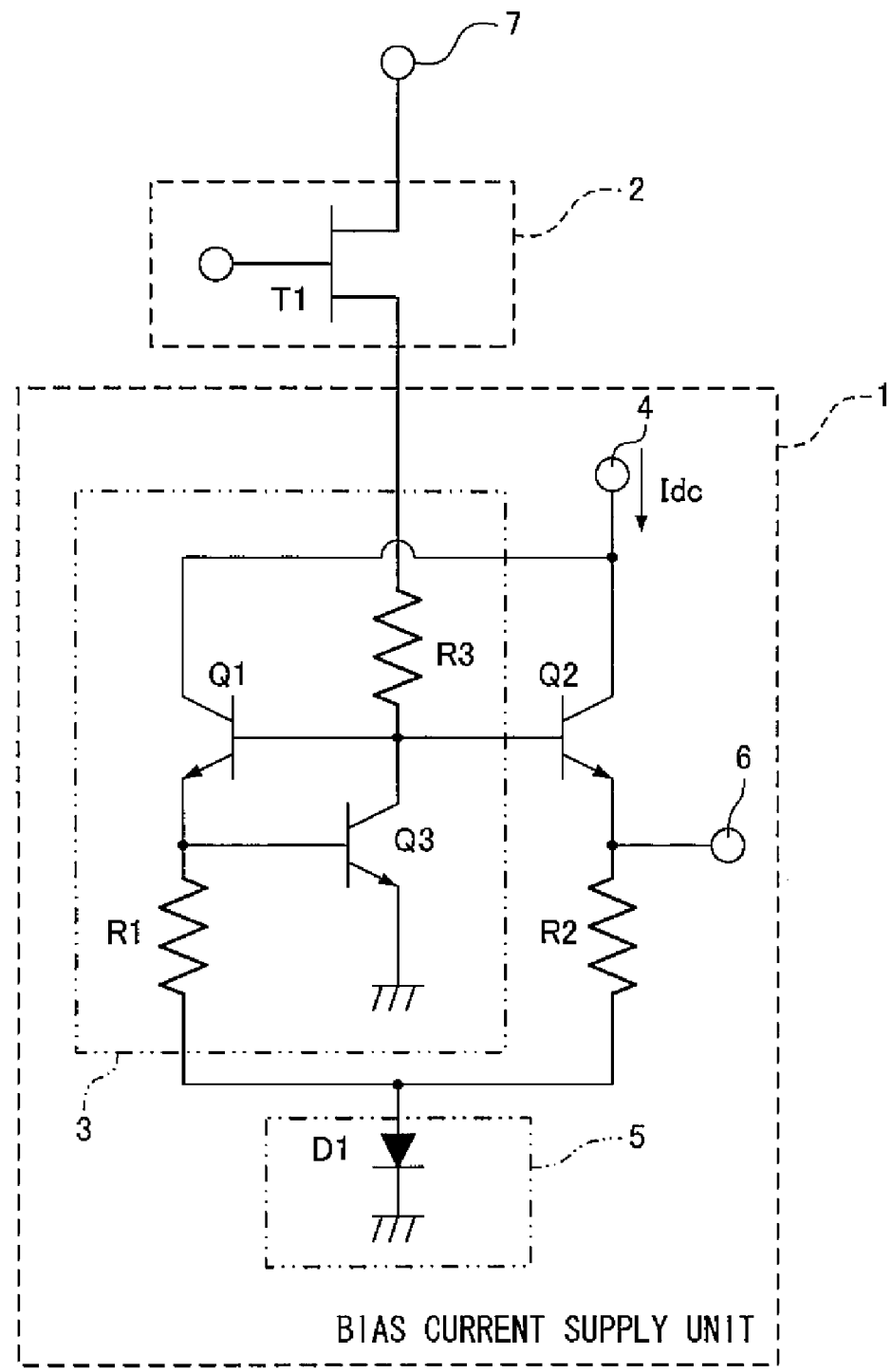
FIG. 1 shows a structural example of a bias circuit according to an embodiment of the present invention.

The following will describe an embodiment of a bias circuit and a wireless communication device including the bias circuit according to the present invention, with reference to the accompanying drawings. The same constituent elements are indicated by the same reference numerals and the explanation thereof may be omitted.

In the following explanation, a bipolar transistor will be referred to as a transistor.

First, the bias circuit of the present embodiment will be described below.

FIG. 1 shows a structural example of the bias circuit according to the present embodiment. In the bias circuit of FIG. 1, an emitter potential generating device 5 is connected to the emitters of the transistors Q1 and Q2 of the bias circuit shown in FIG. 9. This configuration will be specifically described below.

As shown in FIG. 1, the bias circuit of the present embodiment includes a bias current supply unit 1 and a switch element 2. The bias current supply unit 1 includes the transistor Q2, which is an example of a first transistor, a voltage supply circuit 3, and the emitter potential generating device 5.

The transistor Q2 constitutes a collector ground circuit (emitter follower) and a bias current is supplied from the emitter of the transistor Q2. To be specific, the collector of the transistor Q2 is connected to a power supply terminal 4, and a power supply voltage is supplied from the power supply terminal 4 to the collector of the transistor Q2. The emitter of the transistor Q2 is connected to one end of a resistor R2, which is an example of a first resistor. The other end of the resistor R2 is connected to the emitter potential generating device 5. To the base of the transistor Q2, a base voltage is supplied from the voltage supply circuit 3. With this configuration, a bias current can be supplied from an output terminal 6 connected to the emitter of the transistor Q2.

In the present embodiment, the emitter potential generating device 5 for supplying a potential to the emitter of the transistor Q2 is a diode D1 having a cathode connected to a ground potential. The anode of the diode D1 is connected to the emitter of the transistor Q2 via the resistor R2.

Figure 9:
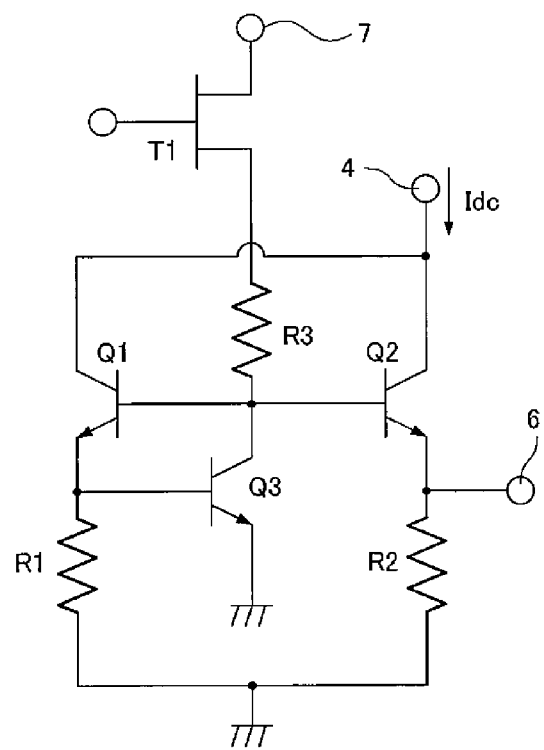
FIG. 9 shows the configuration of a comparative example of a bias circuit in which a depletion-type field-effect transistor is used as a device for stopping bias current supply.

In the bias circuit of FIG. 1, the diode D1 is interposed between the ground potential and the resistors R1 and R2 that are respectively connected to the emitters of the transistors Q1 and Q2 in the bias circuit of FIG. 9.

In the present embodiment, the emitter potential generating device 5 generates a potential determined by adding the forward voltage (leading edge voltage) Vf of the diode D1 to the ground potential. The potential generated by the emitter potential generating device 5 is supplied to the emitter of the transistor Q2 through the resistor R2.

The voltage supply circuit 3 is connected to a power supply terminal 7 via the switch element 2. In the present embodiment, the switch element 2 is a depletion-type field-effect transistor T1. Hereinafter, the depletion-type field-effect transistor T1 will be referred to as D-FET_T1.

The voltage supply circuit 3 supplies a base voltage to the base of the transistor Q2 in response to the on/off of the D-FET_T1. Specifically, when the D-FET_T1 is turned on, a reference voltage is supplied from the power supply terminal 7 to the voltage supply circuit 3 through the D-FET_T1. The voltage supply circuit 3 fed with the reference voltage applies the base voltage to the transistor Q2. Thus the bias current is supplied from the emitter of the transistor Q2. Conversely, when the D-FET_T1 is turned off to interrupt the reference voltage, the supply of the bias current is stopped. The on/off of the reference voltage is controlled thus in response to the on/off of the D-FET_T1.

The following will describe the configuration of the voltage supply circuit 3 according to the present embodiment.

In the present embodiment, the voltage supply circuit 3 includes two transistors that are the transistor Q1 and a transistor Q3, and two resistors that are the resistor R1 and a resistor R3.

The collector of the transistor Q1, which is an example of a second transistor, is connected to the power supply terminal 4. From the power supply terminal 4, a power supply voltage is supplied to the collector of the transistor Q2. The emitter of the transistor Q1 is connected to one end of the resistor R1, which is an example of a second resistor. The other end of the resistor R1 is connected to the anode of the diode D1, which is an example of the emitter potential generating device 5. Thus the potential determined by adding the forward voltage Vf of the diode D1 to the ground potential is supplied to the emitter of the transistor Q1 through the resistor R1. The base of the transistor Q1 is connected to one end of the resistor R3, which is an example of a third resistor. The other end of the resistor R3 is connected to the power supply terminal 7 via the D-FET_T1. Thus when the D-FET_T1 is turned on, the reference voltage is applied to the base of the transistor Q1 through the resistor R3.

The collector of the transistor Q3, which is an example of a third transistor, is connected to the base of the transistor Q1. The emitter of the transistor Q3 is connected to the ground potential. The base of the transistor Q3 is connected to the emitter of the transistor Q1.

The base of the transistor Q1 and the collector of the transistor Q3 are connected to the base of the transistor Q2. Thus when the D-FET_T1 is turned on, the reference voltage is applied in common to the bases of the transistors Q1 and Q2 through the resistor R3. The reference voltage is determined according to, e.g., the base-emitter voltage characteristics of the transistors Q1 and Q2 and a potential supplied to the emitters of the transistors Q1 and Q2. In the present embodiment, as has been discussed, the potential determined by adding the forward voltage Vf of the diode D1 to the ground potential is supplied to the emitters of the transistors Q1 and Q2 through the resistors R1 and R2.

The voltage supply circuit 3 is configured thus. The above-described voltage supply circuit is merely exemplary. The voltage supply circuit for supplying the base voltage to the transistor Q2 is not limited to the configuration of FIG. 1 and other circuit configurations may be used.

The operation of the bias circuit configured thus will be described below.

In the bias circuit, when the D-FET_T1 is turned off, which is a device for controlling the on/off of the reference voltage, the reference voltage supplied from the power supply terminal 7 is interrupted and the bias current supply is stopped.

Further, in a period during which the bias current supply is stopped, the bias circuit causes potential differences between the bases and emitters of the transistors Q1 and Q2 to fall below saturation voltages at the junctions of the transistors Q1 and Q2, and reduces a current Idc passing through the collectors of the transistors Q1 and Q2 from the power supply terminal 4, thereby reducing power consumption.

As shown in FIG. 9, in the case where the emitters of the transistors Q1 and Q2 are connected to the ground potential via the resistors R1 and R2, a voltage not lower than the saturation voltages at the junctions of the transistors Q1 and Q2 is applied to the bases of the transistors Q1 and Q2 depending on the threshold voltage of the D-FET_T1. When a voltage not lower than the saturation voltages at the junctions of the transistors Q1 and Q2 is applied to the bases of the transistors Q1 and Q2, the transistors Q1 and Q2 cannot be completely turned off and the current Idc flows from the power supply terminal 4 to the collectors of the transistors Q1 and Q2, resulting in an increase in power consumption.

In the bias circuit of the present embodiment, the diode D1 is interposed between the resistors R1 and R2 and the ground potential and thus the potential applied to the emitters of the transistors Q1 and Q2 is raised by the forward voltage Vf of the interposed diode D1. Even if a voltage for turning off the D-FET_T1 applies a voltage not lower than the saturation voltages at the junctions of the transistors Q1 and Q2 to the bases of the transistors Q1 and Q2, potential differences between the bases and emitters of the transistors Q1 and Q2 can be smaller than the saturation voltages at the junctions of the transistors Q1 and Q2. Consequently, the current Idc flowing from the power supply terminal 4 to the collectors of the transistors Q1 and Q2 can be reduced to achieve lower power consumption.

Figure 2:
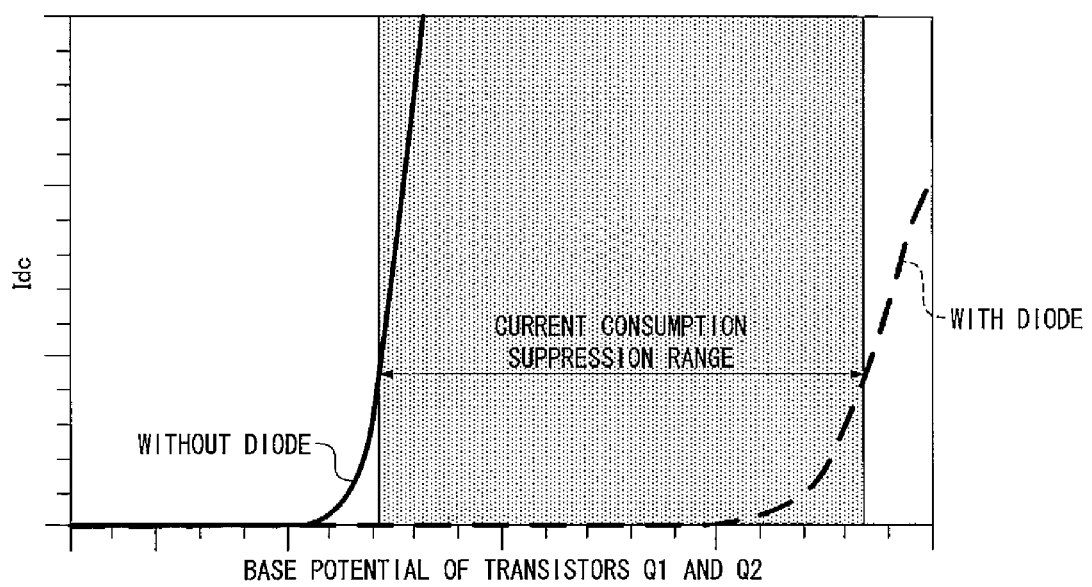
FIG. 2 is an explanatory drawing showing a current Idc passing through the bias circuit according to the embodiment of the present invention.

FIG. 2 is an explanatory drawing showing the current Idc passing through the bias circuit according to the embodiment of the present invention. Specifically, in FIG. 2, a solid line represents the relationship between the base voltages of the transistors Q1 and Q2 and the current Idc in the bias circuit of FIG. 9, and a broken line represents the relationship between the base voltages of the transistors Q1 and Q2 and the current Idc in the bias circuit according to the present embodiment.

As shown in FIG. 2, the interposed diode D1 can increase the level of the base voltage at the start of the passage of the current Idc. Thus in a period during which the bias current supply is stopped, the current Idc passing through the bias circuit can be reduced to achieve lower power consumption. Preferably, the supply of the current Idc to the bias circuit can be stopped in a period during which the bias current supply is stopped.

As is evident from the explanation, even if a voltage not lower than the saturation voltages at the junctions of the transistors Q1 and Q2 is applied to the bases of the transistors Q1 and Q2, the emitters of the transistors Q1 and Q2 are fed with a potential causing potential differences between the bases and emitters of the transistors Q1 and Q2 to fall below the saturation voltages at the junctions of the transistors Q1 and Q2, achieving a considerable reduction in power consumption.

Further, in the bias circuit, the D-FET_T1 is a pseudomorphic high electron mobility transistor (PHEMT) and the bipolar transistors Q1 to Q3 are heterojunction bipolar transistors (HBTs), so that the bias circuit can be formed on the same integrated circuit (IC) as a GaAs linear amplifier.

Figure 3:
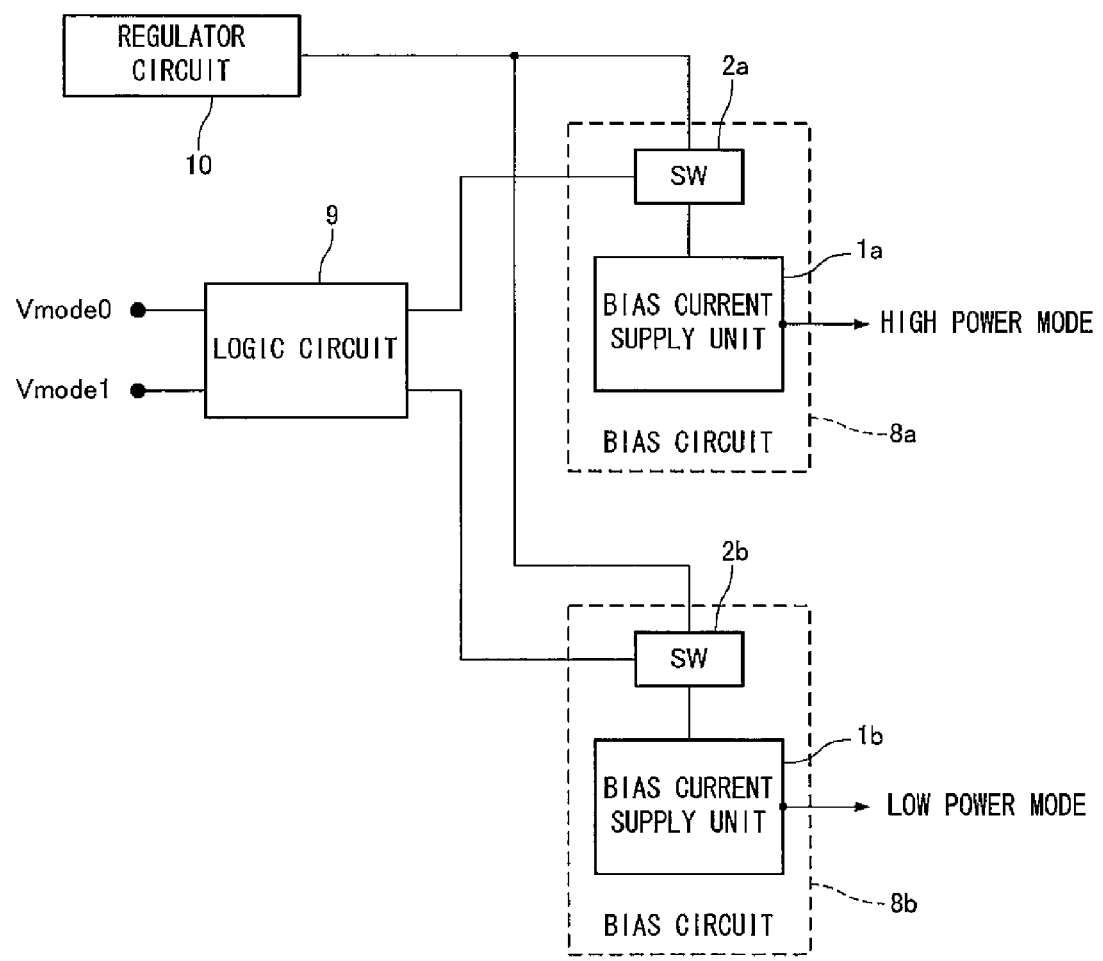
FIG. 3 is a block diagram showing a structural example of the major part of a wireless communication device according to the embodiment of the present invention.

The following will describe a cellular phone as an example of the wireless communication device including the bias circuit according to the present embodiment. The present embodiment will describe a cellular phone having two power modes. FIG. 3 is a block diagram showing a structural example of the major part of the cellular phone according to the present embodiment.

As shown in FIG. 3, the cellular phone according to the present embodiment has high power mode (normal mode) and low power mode (power saving mode). Bias circuits 8a and 8b are provided for the respective modes. The bias circuits 8a and 8b are identical to the bias circuit of the present embodiment.

The cellular phone further includes a logic circuit 9 and a regulator circuit 10. The logic circuit 9 controls switch elements 2a and 2b of the bias circuits 8a and 8b, and the regulator circuit 10 supplies a reference voltage Vref in common to bias current supply units 1a and 1b of the bias circuits 8a and 8b through the switch elements 2a and 2b.

The logic circuit 9 controls the switch elements 2a and 2b of the bias circuits 8a and 8b, so that the modes of the cellular phone are switched.

An example of a mode switching method in the cellular phone will be described below.

First, the following will describe an operation of the cellular phone in high power mode. When a logic signal Vmode0 and a logic signal Vmode1 to the logic circuit 9 are respectively set at H level and L level, the logic circuit 9 applies a potential to the switch element 2a to turn on the switch element 2a and applies a potential to the switch element 2b to turn off the switch element 2b. Thus a bias current for high power mode is supplied from the bias current supply unit 1a of the bias circuit 8a; meanwhile, bias current supply from the bias circuit 8b is stopped.

Subsequently, an operation of the cellular phone in low power mode will be described below. When the logic signal Vmode0 and the logic signal Vmode1 to the logic circuit 9 are respectively set at L level and H level, the logic circuit 9 applies a potential to the switch element 2a to turn off the switch element 2a and applies a potential to the switch element 2b to turn on the switch element 2b. Thus bias current supply from the bias circuit 8a is stopped; meanwhile, a bias current for low power mode is supplied from the bias current supply unit 1b of the bias circuit 8b.

Figure 4:
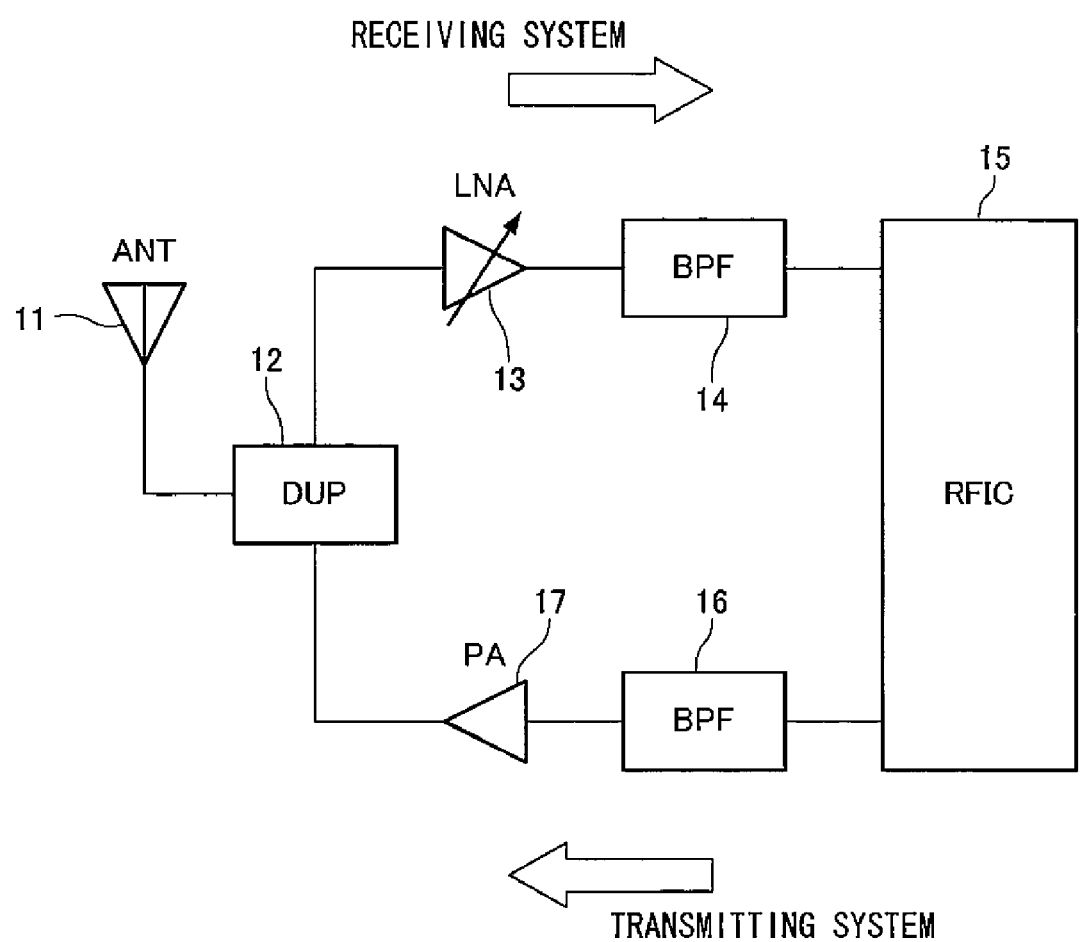
FIG. 4 is a block diagram showing a structural example of the transmitting/receiving system of the wireless communication device according to the embodiment of the present invention.

The configuration of FIG. 3 is included in a radio frequency integrated circuit (RFIC) 15 of FIG. 4. FIG. 4 is a block diagram showing a structural example of the transmitting/receiving system of the cellular phone according to the present embodiment.

As shown in FIG. 4, the cellular phone includes an antenna (ANT) 11 and a duplexer (DUP) 12 for sharing the antenna 11 between a receiving system and a transmitting system. The duplexer 12 transmits received signals of the antenna 11 to the receiving system.

The receiving system includes a low-noise amplifier (LNA) 13, which is a kind of a high-frequency amplifier, and a band-pass filter (BPF) 14. The low-noise amplifier 13 amplifies received signals from the duplexer 12 and the band-pass filter 14 selects received signals transmitted from the low-noise amplifier 13. The received signals having passed through the band-pass filter 14 are processed by the radio frequency integrated circuit 15.

Transmitted signals are sent from the radio frequency integrated circuit 15 to the transmitting system. The transmitting system includes a band-pass filter (BPF) 16 and a power amplifier (PA) 17. The band-pass filter 16 selects transmitted signals from the radio frequency integrated circuit 15 and the power amplifier 17 amplifies the transmitted signals from the band-pass filter 16. The transmitted signals amplified by the power amplifier 17 are sent to the antenna 11 through the duplexer 12.

In the configuration of the cellular phone, the bias circuits 8a and 8b are configured as shown in FIG. 1. Thus also in the case where the switch elements 2a and 2b are D-FETs, it is possible to reduce the current Idc passing through the bias circuits 8a and 8b when the switch elements 2a and 2b are turned off, thereby achieving lower power consumption.

In other words, in the case where the bias circuits 8a and 8b are configured as shown in FIG. 9, the current Idc is applied to the bias circuit 8a for high power mode and increases the power consumption of the bias circuit 8a when, e.g., high power mode is turned off and low power mode is turned on.

In the present embodiment, the bias circuits 8a and 8b are configured as shown in FIG. 1. Thus it is possible to reduce the current Idc passing through the bias circuit 8a for high power mode when, e.g., high power mode is turned off and low power mode is turned on, thereby achieving a considerable reduction in power consumption.

The present embodiment described switching of the power modes. Frequency modes may be switched instead of the power modes.

Figure 5:
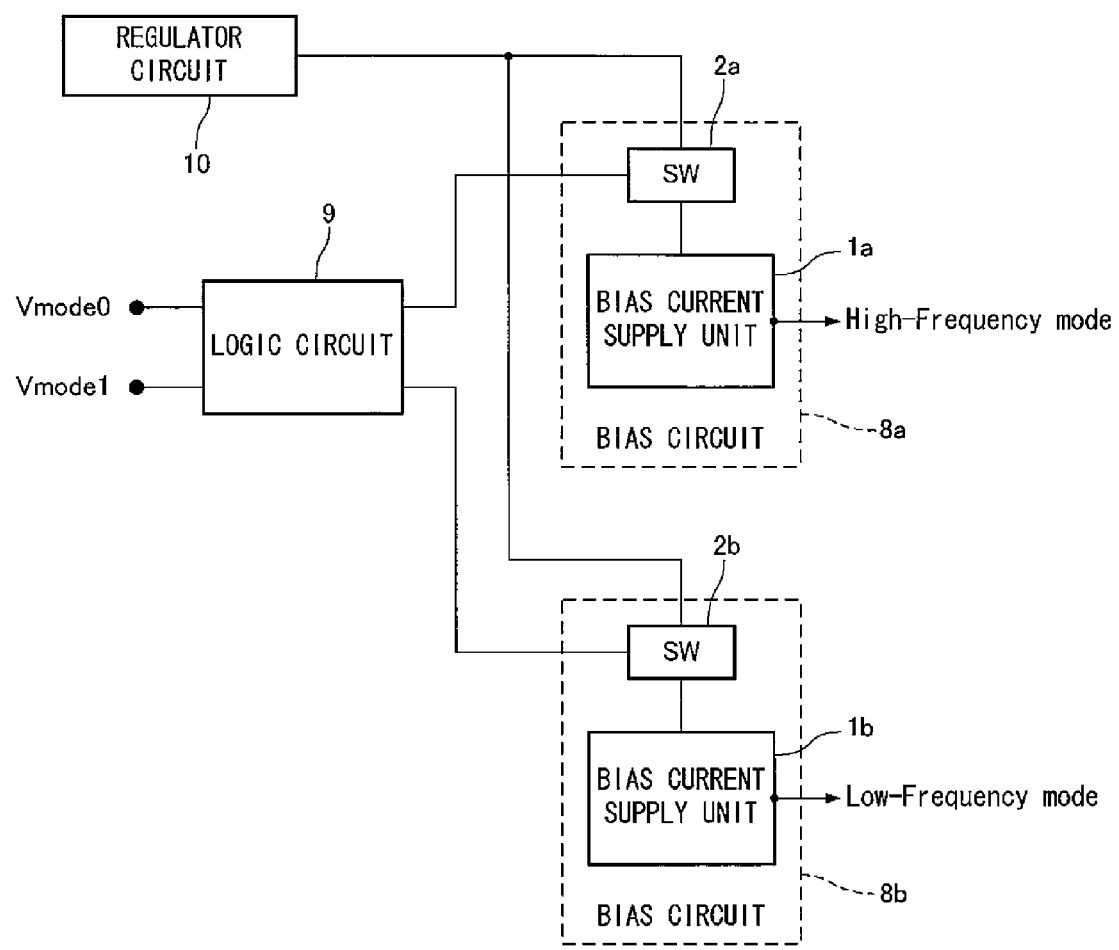
FIG. 5 is a block diagram showing a structural example of the major part of the wireless communication device according to a first example of the embodiment of the present invention.

FIG. 5 shows a structural example of the major part of the cellular phone having two frequency modes. FIG. 5 shows a structure for switching high-frequency mode and low-frequency mode. In FIG. 5, the same members as those of FIG. 3 are indicated by the same reference numerals.

The cellular phone having the two frequency modes includes circuits (not shown) for the respective frequency modes. As shown in FIG. 5, the bias circuits 8a and 8b are provided for the respective circuits of the frequency modes. In the case where the bias circuits 8a and 8b provided for the respective frequency modes are configured according to the present embodiment, power consumption can be considerably reduced.

Figure 6:
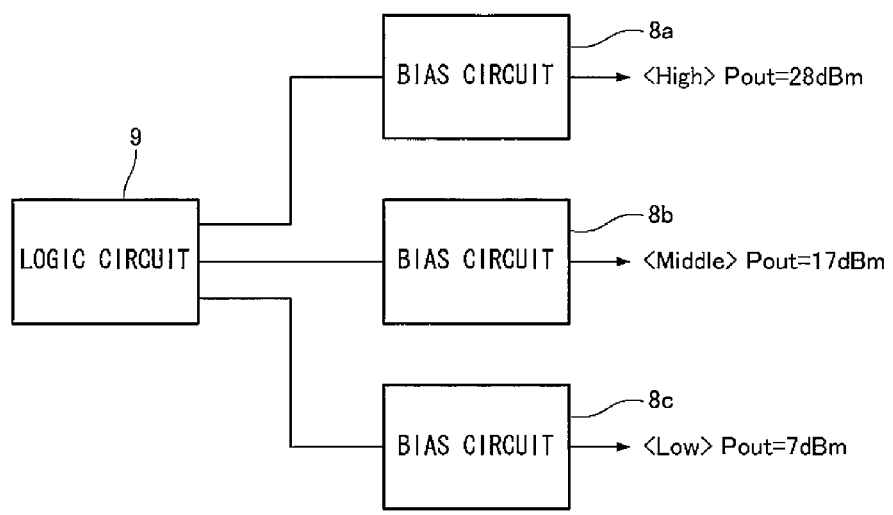
FIG. 6 is a block diagram for explaining a structural example of the major part of the wireless communication device according to a second example of the embodiment of the present invention.

Although the present embodiment described the cellular phone having the two power modes, the cellular phone may have three or more power modes. For example, a cellular phone having three power modes may be configured as shown in FIG. 6. Specifically, as shown in FIG. 6, the cellular phone having high power mode, medium power mode, and low power mode may include bias circuits 8a, 8b, and 8c for the respective modes. In FIG. 6, a power of 28 dBm is supplied from the bias circuit 8a in high power mode, a power of 17 dBm is supplied from the bias circuit 8b in medium power mode, and a power of 7 dBm is supplied from the bias circuit 8c in low power mode.

Figure 7:
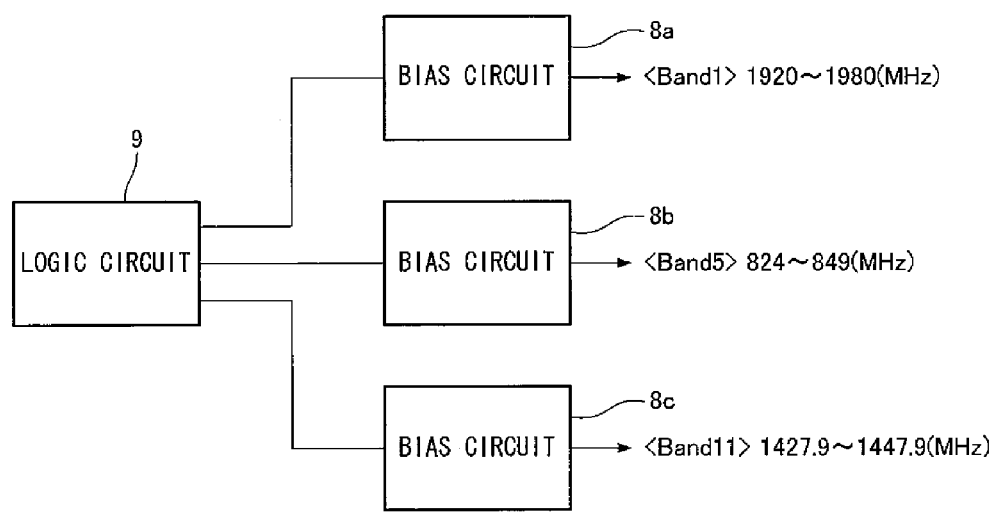
FIG. 7 is a block diagram for explaining a structural example of the major part of the wireless communication device according to a third example of the embodiment of the present invention.
Figure 8:
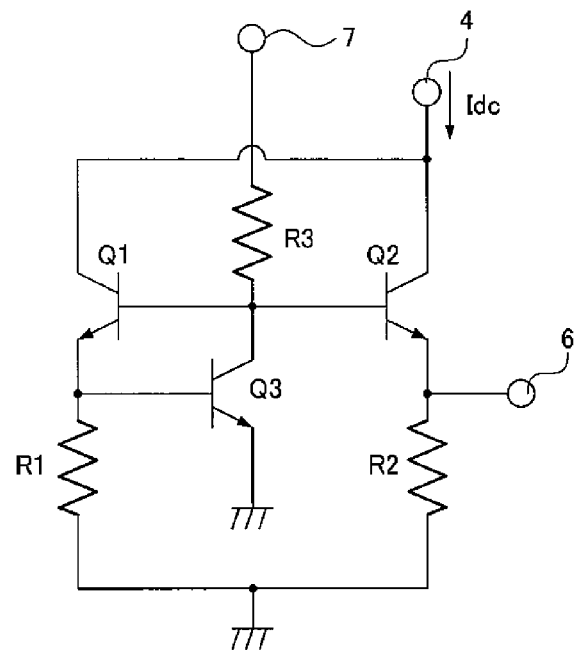
FIG. 8 shows the configuration of a bias circuit according to the related art.

Moreover, a cellular phone may have three or more frequency modes in the present embodiment. For example, a cellular phone having three frequency modes may be configured as shown in FIG. 7. FIG. 7 shows bias circuits 8a, 8b, and 8c provided for a circuit for the 1920-1980 MHz frequency band (BAND 1), a circuit for the 824-849 MHz frequency band (BAND 5), and a circuit for the 1427.9-1447.9 MHz frequency band (BAND 11), respectively.

In the present embodiment, a cellular phone has been described as an example of a wireless communication device. As a matter of course, the present embodiment can be similarly implemented for other devices enabling wireless communications.

The bias circuit and the wireless communication device including the bias circuit according to the present invention can reduce power consumption, and are useful to circuits for supplying a bias current and terminal devices such as cellular phones with multiple modes.

Having specifically described exemplary embodiments of the present invention, it is easily understood by those skilled in the art that various changes can be made in the exemplary embodiments without substantially departing from a new teaching of the present invention and the effect of the present invention. Thus these changes are intended to be embraced in the scope of the present invention.

What is claimed is:

1. A bias circuit comprising:
    a first transistor for supplying a bias current from an emitter of the first transistor,
    an emitter potential generating device for supplying a potential to the emitter of the first transistor;
    a switch element; and
    a voltage supply circuit for supplying a base voltage to a base of the first transistor in response to on/off of the switch element,
    wherein the emitter potential generating device generates a potential causing a potential difference between the base and the emitter of the first transistor to fall below a saturation voltage at a junction of the first transistor, even in the case where the base of the first transistor is fed with a voltage not lower than the saturation voltage at the junction of the first transistor.

2. The bias circuit according to claim 1, further comprising a first resistor having one end connected to the emitter of the first transistor and an other end connected to the emitter potential generating device.

3. The bias circuit according to claim 1, wherein the voltage supply circuit comprises:
    a second transistor having an emitter fed with a potential from the emitter potential generating device and a base fed with a voltage through the switch element; and
    a third transistor having a collector connected to the base of the second transistor, an emitter connected to a ground potential, and a base connected to the emitter of the second transistor, and
    the base of the second transistor is connected to the base of the first transistor.

4. The bias circuit according to claim 3, wherein the voltage supply circuit further comprises:
    a second resistor having one end connected to the emitter of the second transistor and an other end connected to the emitter potential generating device; and
    a third resistor having one end connected to the base of the second transistor and an other end fed with a voltage through the switch element.

5. The bias circuit according to claim 1, wherein the switch element is a depletion-type field-effect transistor.

6. The bias circuit according to claim 1, wherein the emitter potential generating device generates a potential determined by adding a forward voltage of a diode to a ground potential.

7. A wireless communication device with multiple modes, comprising:
    bias circuits provided for the respective modes, the bias circuits being configured according to claim 1; and
    a logic circuit for controlling the switch elements of the bias circuits to switch the modes.

* * * * *